(12) United States Patent
Wu et al.

(10) Patent No.: US 10,347,740 B2
(45) Date of Patent: Jul. 9, 2019

(54) FIN STRUCTURES AND MULTI-VT SCHEME BASED ON TAPERED FIN AND METHOD TO FORM

(71) Applicant: GLOBALFOUNDRIES Inc., Grand Cayman (KY)

(72) Inventors: Xusheng Wu, Ballston Lake, NY (US); Min-hwa Chi, Malta, NY (US); Edmund Kenneth Banghart, Pittsford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/367,366

(22) Filed: Dec. 2, 2016

(65) Prior Publication Data

US 2017/0084718 A1   Mar. 23, 2017

Related U.S. Application Data

(62) Division of application No. 14/523,548, filed on Oct. 24, 2014, now Pat. No. 9,583,625.

(51) Int. Cl.
*H01L 29/78*     (2006.01)
*H01L 29/66*     (2006.01)
(Continued)

(52) U.S. Cl.
CPC .... *H01L 29/66537* (2013.01); *H01L 29/0653* (2013.01); *H01L 29/1033* (2013.01);
(Continued)

(58) Field of Classification Search
None
See application file for complete search history.

(56) References Cited

U.S. PATENT DOCUMENTS 6,642,090 B1   11/2003   Fried et al.
7,141,856 B2   11/2006   Lee et al.
(Continued)

FOREIGN PATENT DOCUMENTS

CN   102446972 A   5/2012

OTHER PUBLICATIONS

Taiwanese Office Action for related Taiwanese Patent Application No. 104117399 dated Dec. 27, 2016, 11 Pages.
(Continued)

*Primary Examiner* — Abul Kalam
(74) *Attorney, Agent, or Firm* — Ditthavong & Steiner, P. C.

(57) ABSTRACT

A method of forming a FinFET fin with low-doped and a highly-doped active portions and/or a FinFET fin having tapered sidewalls for Vt tuning and multi-Vt schemes and the resulting device are provided. Embodiments include forming an Si fin, the Si fin having a top active portion and a bottom active portion; forming a hard mask on a top surface of the Si fin; forming an oxide layer on opposite sides of the Si fin; implanting a dopant into the Si fin; recessing the oxide layer to reveal the active top portion of the Si fin; etching the top active portion of the Si fin to form vertical sidewalls; forming a nitride spacer covering each vertical sidewall; recessing the recessed oxide layer to reveal the active bottom portion of the Si fin; and tapering the active bottom portion of the Si fin.

5 Claims, 2 Drawing Sheets

(51) Int. Cl.
*H01L 29/06* (2006.01)
*H01L 29/10* (2006.01)
*H01L 29/16* (2006.01)

(52) U.S. Cl.
CPC .......... *H01L 29/1083* (2013.01); *H01L 29/16* (2013.01); *H01L 29/6656* (2013.01); *H01L 29/66795* (2013.01); *H01L 29/66803* (2013.01); *H01L 29/66818* (2013.01); *H01L 29/7851* (2013.01); *H01L 29/7853* (2013.01)

(56) References Cited

U.S. PATENT DOCUMENTS

| | | | |
|---|---|---|---|
| 7,297,600 B2 | 11/2007 | Oh et al. | |
| 8,148,775 B2 | 4/2012 | Gilgen et al. | |
| 8,546,891 B2 * | 10/2013 | Chang | H01L 29/06 257/401 |
| 9,595,475 B2 * | 3/2017 | Liaw | H01L 21/82343 |
| 9,640,640 B1 * | 5/2017 | Doris | H01L 29/66795 |
| 9,660,077 B2 * | 5/2017 | Cheng | H01L 29/7847 |
| 9,761,717 B2 * | 9/2017 | Cheng | H01L 29/7847 |
| 2008/0014699 A1 | 1/2008 | Torek et al. | |
| 2009/0278196 A1 | 11/2009 | Chang et al. | |
| 2012/0086053 A1 | 4/2012 | Tseng et al. | |
| 2013/0093026 A1 * | 4/2013 | Wann | H01L 21/82382 257/401 |
| 2013/0105867 A1 | 5/2013 | Wang et al. | |
| 2013/0200483 A1 | 8/2013 | Tung | |
| 2013/0270641 A1 * | 10/2013 | Chi | H01L 21/82382 257/351 |
| 2013/0280883 A1 * | 10/2013 | Faul | H01L 21/2255 438/434 |
| 2014/0091394 A1 | 4/2014 | Li et al. | |
| 2014/0131831 A1 * | 5/2014 | Wei | H01L 21/77 257/506 |
| 2015/0187909 A1 | 7/2015 | Yan et al. | |
| 2016/0027903 A1 | 1/2016 | Chang et al. | |

OTHER PUBLICATIONS

Jan et al., "A 22nm SoC Platform Technology Featuring 3-D Tri-Gate and High-k/Metal Gate, Optimized for Ultra Low Power, High Performance and High Density SoC Applications", IEEE International Electron Devices Meeting, 2012, retrieved on Nov. 29, 2016 from http://robotics.eecs.berkeley.edu/~pister/147fa14/Resources/Intel22nm.pdf, 4 Pages.

Kim et al., "Wet Isotropic and Anisotropic Etching", ENEE 416, 2007, retrieved on Nov. 29, 2016 from https://www.ece.umd.edu/class/enee416.F2007/GroupActivities/Presentation3.pdf, 19 Pages.

Park et al., "Etch Profile Control of High-Aspect Ratio Deep Submicrometer Alpha-Si Gate Etch", IEEE Transactions on Semiconductor Manufacturing, vol. 14, No. 3, retrieved on Nov. 29, 2016 from http://web.eecs.umich.edu/~fredty/My%20Papers/Process%20Control%20and%20Etch/Semic_Manuf_Aug_2001_Park.pdf, Aug. 2001, pp. 242-254.

Office Action for the related Chinese Patent Application No. 201510696311.0, dated Dec. 27, 2017, 19 pages.

Office Action for the related Chinese Patent Application No. 20151069311.0, dated Sep. 27, 2018, 15 pages.

* cited by examiner

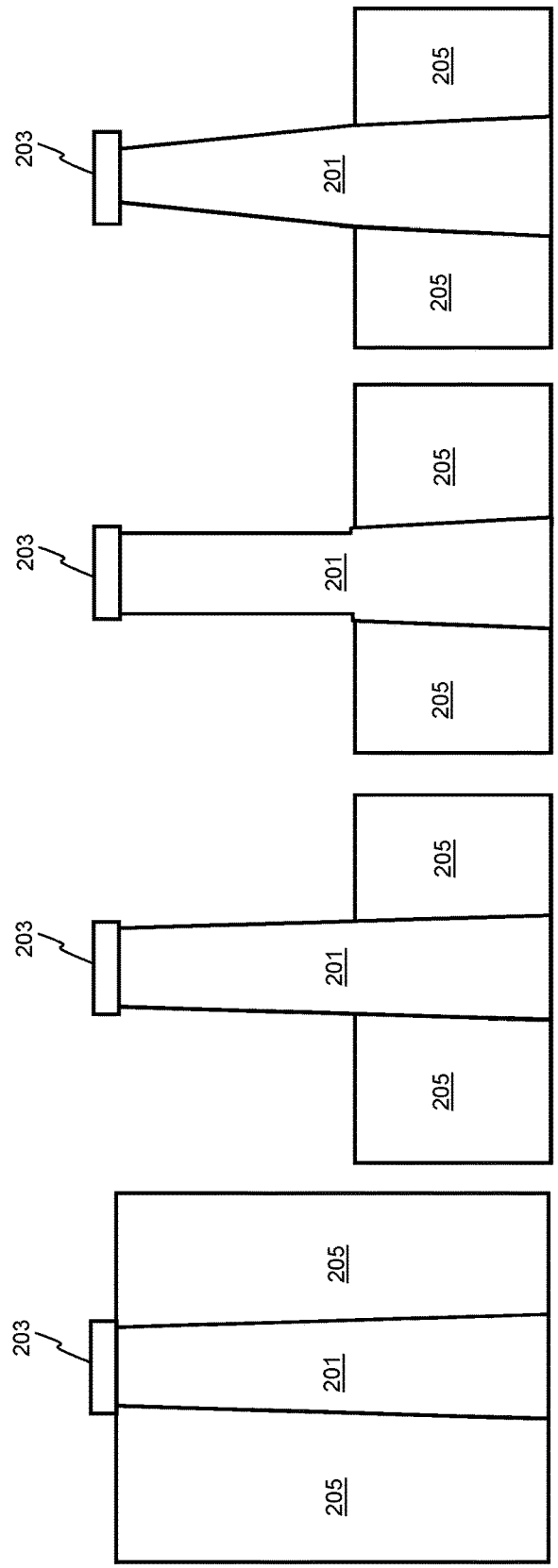

US 10,347,740 B2

FIN STRUCTURES AND MULTI-VT SCHEME BASED ON TAPERED FIN AND METHOD TO FORM

CROSS-REFERENCE TO RELATED APPLICATION

This application is a Divisional of U.S. application Ser. No. 14/523,548, filed Oct. 24, 2014, the content of which is incorporated herein by reference in its entirety.

TECHNICAL FIELD

The present disclosure relates to the manufacture of semiconductor devices with fin-type field effect transistors (FinFETs). The disclosure is particularly applicable to 14 nanometer (nm) technology nodes and beyond.

BACKGROUND

In FinFET technologies at 14 nm node and beyond, the structure of the fin is critical for device performance. Narrow fin width, e.g., 5 nm to 10 nm, is the key requirement/feature that can affect the control of short channel effects and enhance transistor performance. However, narrow fins also result in a very small silicon channel volume and, therefore, an insufficient channel or halo implant dose. Consequently, FinFET devices have low threshold voltage (Vt) sensitivity to implants. Even though the implant technique is a simple and easy way to tune the Vt of a FinFET device, it is difficult to use effectively due to the FinFET device's low sensitivity.

In addition, current density at the top of a conventional trapezoidal shaped or almost triangular shaped fin is increased as gate voltage (Vg) increases. Therefore, the top of the fin can increase the ON-current ($I_{on}$) and, therefore, directly affect fin performance. A taller fin increases performance inefficiently because it does not touch the high current area, i.e., the fin top. In contrast, the bottom of a fin contributes more at low Vg, which is an OFF-state. Consequently, good control of the bottom of a fin will modulate Vt in a more efficient manner.

A known approach for implementing a multi-Vt scheme, e.g., super low threshold voltage (SLVT), low threshold voltage (LVT), regular threshold voltage (RVT), and high threshold voltage (HVT), includes using multiple work-function (WF) metals. However, the multi-metal WF scheme is challenging due to a complicated fabrication process, e.g., patterning, WF metal fill, work-function drifting, etc.

A need therefore exists for methodology enabling simple and controllable multi-Vt schemes and Vt tuning of FinFET devices and the resulting devices.

SUMMARY

An aspect of the present disclosure is a process of forming a FinFET fin having a low-doped active top portion with vertical sidewalls and a highly-doped active bottom portion with tapered sidewalls and the resulting device.

Another aspect of the present disclosure is a process of forming a FinFET fin with tapered sidewalls for Vt tuning and multi-Vt schemes.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon (Si) fin, the Si fin having an active top portion and an active bottom portion; forming a hard mask on a top surface of the Si fin; forming an oxide layer on opposite sides of the Si fin; implanting a dopant into the Si fin; recessing the oxide layer to reveal the active top portion of the Si fin; etching the active top portion of the Si fin to form vertical sidewalls; forming a nitride spacer covering each vertical sidewall; recessing the recessed oxide layer to reveal the active bottom portion of the Si fin; and tapering the active bottom portion of the Si fin.

Aspects of the present disclosure include forming the Si fin by etching. Other aspects include implanting a dopant into the Si fin using a vertical channel implant or a punch-through stop (PTS) vertical implant. Further aspects include forming the active top portion of the Si fin to a width of 3 nm to 15 nm. Additional aspects include recessing the oxide layer 25 nm to 60 nm to reveal the active top portion of the Si fin. Another aspect includes recessing the recessed oxide layer 10 nm to 20 nm to reveal the active bottom portion of the Si fin. Other aspects include tapering the active bottom portion of the Si fin by lateral dry etching the active bottom portion while recessing the recessed oxide layer. Further aspects include tapering the active bottom portion of the Si fin by wet etching the active bottom portion after recessing the recessed oxide layer.

Another aspect of the present disclosure is a method including: forming a Si fin; forming a hard mask on a top surface of the Si fin; forming an oxide layer on opposite sides of the Si fin; implanting a dopant into the Si fin; recessing the oxide layer to reveal an active Si fin; and modifying sidewalls of the active Si fin by etching.

Aspects of the present disclosure include forming the Si fin by etching. Other aspects include implanting a dopant into the Si fin with a vertical channel implant or a PTS vertical implant. Further aspects include recessing the oxide layer 20 nm to 60 nm to reveal the active Si fin. Additional aspects include etching the sidewalls by plasma Si etching to increase a verticality of the sidewalls. Another aspect includes etching the sidewalls selectively to form multiple levels of sidewall verticality. Other aspects include etching the sidewalls by plasma Si etching to taper each sidewall. Further aspects include etching the sidewalls selectively with masking steps to form multiple levels of tapered sidewalls. Additional aspects include recessing the oxide layer with lateral or vertical etching by tuning selectivity.

A further aspect of the present disclosure is a device including: a Si fin formed, the Si fin having a low-doped active top portion with vertical sidewalls and a highly-doped active bottom portion with tapered sidewalls; and a shallow trench isolation (STI) layer formed on opposite sides of the Si fin. Aspects of the present device include the active top portion being formed to a height of 25 nm to 60 nm and a width of 3 nm to 15 nm, and the active bottom portion being formed to a height of 10 nm to 20 nm. Other aspects include the tapered active bottom portion being doped using a vertical channel implant or a PTS vertical implant.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2D schematically illustrate a process flow for forming a FinFET fin with tapered sidewalls for Vt tuning and multi-Vt schemes.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current processing problems of complicated patterning, WF metal fill, and WF drifting attendant upon using multiple WF metals to tune the Vt of a FinFET device and/or enable multi-Vt FinFETs.

Methodology in accordance with embodiments of the present disclosure includes forming a Si fin, the Si fin having a top active portion and a bottom active portion. A hard mask is formed on a top surface of the Si fin. An oxide layer is formed on opposite sides of the Si fin. A dopant is implanted into the Si fin. The oxide layer is recessed to reveal the top active portion of the Si fin. The top active portion of the Si fin is etched to form vertical sidewalls, and a nitride spacer is formed covering each vertical sidewall. The recessed oxide layer is further recessed to reveal the bottom active portion of the Si fin. The bottom active portion of the Si fin is tapered, and a dopant is implanted into the bottom active portion of the Si fin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
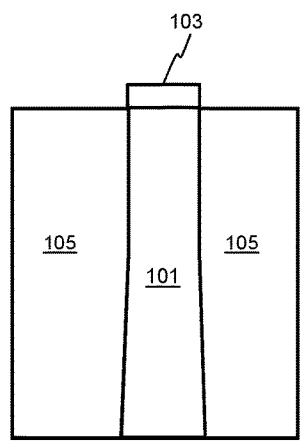
FIGS. 1A through 1E schematically illustrate a process flow for forming a FinFET fin with a low-doped active top portion and a highly-doped active bottom portion, in accordance with an exemplary embodiment.
Figure 1B:
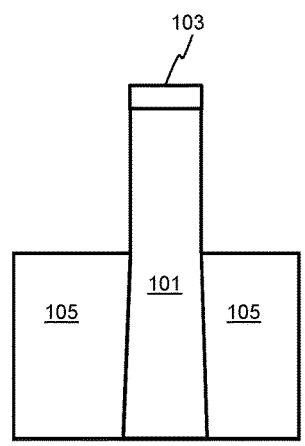
Figure 1C:
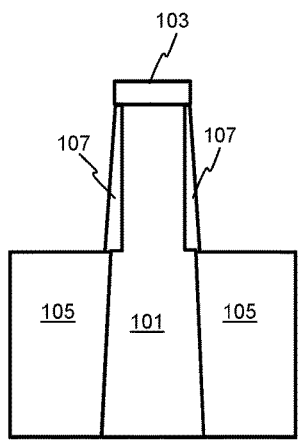
Figure 1D:
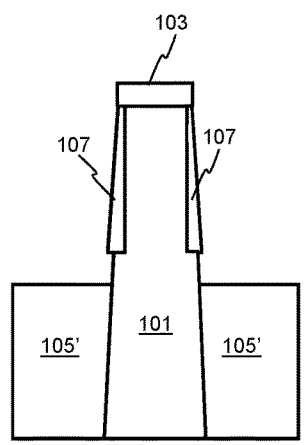

Adverting to FIG. 1A, a Si fin 101 is formed e.g., by etching. A hard mask layer 103 is formed on a top surface of the Si fin 101, e.g., by multi-layer deposition, patterning, and etching. An oxide layer 105, e.g., a STI layer, is formed on opposite sides of the Si fin 101. The top portion of the Si fin 101 may be formed to a width of 3 nm to 15 nm, for example. The Si fin 101 is then implanted, e.g., by a vertical channel implant or a PTS vertical implant. Next, the oxide layer 105 is recessed, e.g., 25 nm to 60 nm, to reveal the top active portion of the Si fin 101 as depicted in FIG. 1B. The Si fin 101 is then etched, e.g., a slight trim, to form vertical sidewalls above oxide layer 105, as depicted in FIG. 1C. A nitride spacer 107 is then formed on each vertical sidewall of the Si fin 101 to protect the top active portion. Adverting to FIG. 1D, the oxide layer 105 is again recessed, e.g., 10 nm to 20 nm, forming oxide layer 105' and revealing the bottom active portion of the Si fin 101.

Figure 1E:
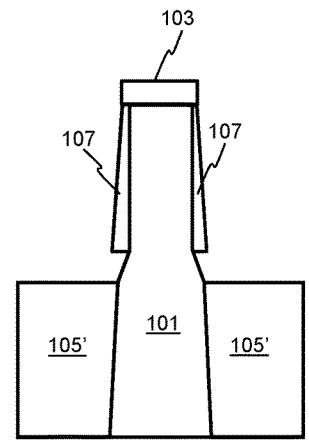

The revealed bottom active portion of the Si fin 101 may then be wet etched, e.g., using tetramethylammonium hydroxide (TMAH), for a desired sidewall taper, e.g., 54.7°, as depicted in FIG. 1E. Alternatively, while the oxide layer 105 is being recessed, the bottom active portion of the Si fin 101 may be dry etched laterally. Next, the hard mask 103 and the nitride vertical spacers 107 are removed (not shown for illustrative convenience). Thereafter, conventional processing proceeds (not shown for illustrative convenience), e.g., gate stack formation, source/drain junction formation, replacement gate formation, silicide and contact formation, and BEOL interconnections. Consequently, the top active portion of the Si fin 101 is low-doped for high mobility and the bottom active portion has Vt tuning sensitivity for isolation and optimized device design. In addition, the oxide layer 105' may be further recessed (not shown for illustrative convenience) to form multiple groups of taper sidewall selectively at the Si fin 101 and, therefore, enable a multi-Vt scheme based upon a single channel implant.

Adverting to FIG. 2A, similar to FIG. 1A, a Si fin 201 is formed, e.g., by etching. A hard mask 203 is then formed on a top surface of the Si fin 201, e.g., by multi-layer deposition, patterning, and etching. Next, an oxide layer 205, e.g., a STI layer, is formed on opposite sides of the Si fin 101. The Si fin 201 is then implanted, e.g., by a vertical channel implant or a PTS vertical implant. The oxide layer 205 may then be recessed, e.g., 20 nm to 60 nm, to reveal the active Si fin 201, as depicted in FIG. 2B. After the oxide layer 205 is recessed, the active Si fin 201 may already have some tapering, i.e., the lower portion of the active Si fin 201 is wider than the upper portion of the active Si fin 201. The sidewalls of the active Si fin 201 may then be modified, e.g., by plasma Si etching, as depicted in FIG. 2C. For example, the sidewalls may be modified to increase the verticality of each sidewall, i.e., making the sidewalls less tapered. In addition, the modification of the sidewalls may be performed selectively by masking steps to form multiple levels of verticality (not shown for illustrative convenience) or less tapering. In particular, when the active Si fin 201 is formed with multiple groups of tapered sidewalls selectively, e.g., extra masking and Si etching steps, multi-Vt may result from only one channel implant. Further, the multi-Vt scheme can be applicable to both n-type and p-type FinFETs.

The sidewalls of the active Si fin 201 may also be modified, e.g., by plasma Si etching, to be more tapered by adding lateral etching, as depicted in FIG. 2D. The modification of the active Si fin 201 to increase sidewall tapering may also be performed selectively by masking steps to form multiple levels for a multi-Vt scheme. Alternatively, the steps of recessing the oxide 203 in FIG. 2B and plasma etching of the active Si fin 201 in FIG. 2C or 2D may be combined by tuning selectivity. Next, the hard mask 205 is removed (not shown for illustrative convenience). Thereafter, as with FIG. 2A, conventional processing proceeds (not shown for illustrative convenience), e.g., gate stack formation, source/drain junction formation, replacement gate formation, silicide and contact formation, and BEOL interconnections. Consequently, the Vt of the active Si fin 201 can be tuned by the channel implant dose and multiple Vts can be formed by using the same channel Vt implant conditions.

The embodiments of the present disclosure can achieve several technical effects including forming a FinFET fin structure having low-doped and highly-doped active portions and/or tapered sidewalls in a manner much simpler than forming the FinFET fin using a conventional multi-Vt scheme such as performing multi-WF in the replacement gate stack scheme. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in 14 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a silicon (Si) fin;
forming a hard mask on a top surface of the Si fin;
forming an oxide layer on opposite sides of the Si fin;
implanting a dopant into the Si fin with a vertical channel implant or a punch-through stop (PTS) vertical implant;
recessing the oxide layer to reveal an active area of the Si fin; and
modifying sidewalls of the active area of the Si fin by etching the sidewalls with plasma Si etching,
wherein the plasma Si etching comprises selectively etching the sidewalls to form multiple levels of verticality of the sidewalls.

2. The method according to claim 1, wherein the forming of the Si fin comprises etching.

3. The method according to claim 1, wherein the recessing of the oxide layer comprises recessing the oxide layer 20 nanometer (nm) to 60 nm to reveal the active area of the Si fin.

4. The method according to claim 1, wherein the recessing the oxide layer comprises recessing with lateral or vertical etching by tuning selectivity.

5. A method comprising:
forming a silicon (Si) fin;
forming a hard mask on a top surface of the Si fin;
forming an oxide layer on opposite sides of the Si fin;
implanting a dopant into the Si fin with a vertical channel implant or a punch-through stop (PTS) vertical implant;
recessing the oxide layer to reveal an active area of the Si fin; and
modifying sidewalls of the active area of the Si fin by etching the sidewalls with plasma Si etching,
wherein the plasma Si etching comprises selectively etching the sidewalls with masking steps to form multiple levels of tapered sidewalls.

* * * * *